US009620365B2

(12) United States Patent
Rananavare et al.

(10) Patent No.: US 9,620,365 B2
(45) Date of Patent: Apr. 11, 2017

(54) METHOD FOR PATTERNING SUB-50-NANOMETERS STRUCTURES (71) Applicant: Portland State University, Portland, OR (US)

(72) Inventors: Shankar B. Rananavare, Hillsboro, OR (US); Moshood Kayode Morakinyo, Portland, OR (US)

(73) Assignee: Portland State University, Portland, OR (US)

( * ) Notice: Subject to any disclaimer, the term of this patent is extended or adjusted under 35 U.S.C. 154(b) by 0 days.

(21) Appl. No.: 14/904,350

(22) PCT Filed: Jul. 11, 2014

(86) PCT No.: PCT/US2014/046347
§ 371 (c)(1),
(2) Date: Jan. 11, 2016

(87) PCT Pub. No.: WO2015/006688
PCT Pub. Date: Jan. 15, 2015

(65) Prior Publication Data
US 2016/0155660 A1 Jun. 2, 2016

Related U.S. Application Data (60) Provisional application No. 61/845,201, filed on Jul. 11, 2013.

(51) Int. Cl.
*H01L 21/308* (2006.01)
*H01L 21/033* (2006.01)
(Continued)

(52) U.S. Cl.
CPC .......... *H01L 21/0337* (2013.01); *C03C 15/00* (2013.01); *C23F 1/00* (2013.01);
(Continued)

(58) Field of Classification Search
None
See application file for complete search history.

(56) References Cited

U.S. PATENT DOCUMENTS

2004/0048441 A1 3/2004 Akatsu et al.
2009/0136785 A1* 5/2009 Chen .................. B81C 1/00031
428/846
2012/0193762 A1 8/2012 Lin et al.

FOREIGN PATENT DOCUMENTS

KR 1990/0001272 3/1990
KR 2009000889 A 1/2009
(Continued)

OTHER PUBLICATIONS

Liang-Chieh Ma et al. "Electrostatic Funneling for Precise Nanoparticle Placement: A route to Wafer-Scale Integration", 2007 vol. 7, No. 2, pp. 439-445.

*Primary Examiner* — Jiong-Ping Lu
(74) *Attorney, Agent, or Firm* — Blank Rome LLP (57) ABSTRACT

Sub-50-nm structures are formed using sequential top-down and bottom up lithographies in conjunction with selective etching. The preferred rendition of the method involves: (a) rough lithographic patterning, (b) size/shape selected nanostructure deposition, (c) resist reflow around the nanostructures, and (d) selective removal/etching of the nanostructure.

19 Claims, 9 Drawing Sheets

(51) Int. Cl.
*H01L 21/027* (2006.01)
*H01L 21/311* (2006.01)
*H01L 21/768* (2006.01)
*C03C 15/00* (2006.01)
*C23F 1/00* (2006.01)

(52) U.S. Cl.
CPC ...... *H01L 21/0273* (2013.01); *H01L 21/0338* (2013.01); *H01L 21/3086* (2013.01); *H01L 21/31144* (2013.01); *H01L 21/76802* (2013.01); *H01L 21/76816* (2013.01)

(56) References Cited

FOREIGN PATENT DOCUMENTS

| KR | 20090106884 A | 10/2009 |
| KR | 20120074902 A | 7/2012 |
| KR | 10-2013/0023284 | 7/2013 |

* cited by examiner

PATTERN AFTER 2 MINS REFLOW

FIG. 4B

PATTERN AFTER 5 MINS COMPLETE REFLOW

FIG. 4C

PATTERN AFTER OXYGEN PLASMA ETCHING
OF PMMA AND IODINE ETCHING OF Au NPs

METHOD FOR PATTERNING SUB-50-NANOMETERS STRUCTURES

RELATED APPLICATIONS

This application is a national phase of PCT/US2014/046347, filed on Jul. 11, 2014, which claims the benefit of U.S. Provisional Application No. 61/845,201, filed on Jul. 11, 2013, the entire contents of which are incorporated herein by reference.

FIELD OF THE INVENTION

The present invention is directed to a method for patterning very small (preferably smaller than 50 nanometers) structures and more particularly to such a method using resist and nanostructures in the fabrication of semiconductors or other articles of manufacture requiring such small structures. The method allows removal of shot noise and line-edge roughness.

DESCRIPTION OF RELATED ART

The ability of the semiconductor industry to march on the path set up by Moore's power law has been paved through major breakthroughs in lithography. Currently, modern lithography faces severe challenges in patterning on ever decreasing nanometer-level features; these include the optical resolution limit, nanometer scale linewidth roughness, and shot noise. To overcome the optical resolution limit, excimer lasers with phase shifted masks and even immersion (borrowed from optical microscopy) in liquids have been employed. The problem of linewidth roughness arises in part from the finite molecular size of the polymers used in photoresists (imaging emulsions), which could, in principle, be overcome through the use of lower molecular weight polymers and ultimately through the use of molecular resists. An additional contribution to line-edge roughness is the shot noise, caused by statistical fluctuation in the small number of photons/particles needed to pattern on a nanometer scale. Shot noise leads to fluctuation in pattern dimensions, especially for extreme ultraviolet (EUV) and electron-beam (E-beam) lithography. Furthermore, the current practice of using supersensitive patterning emulsions, i.e., chemically amplified (quantum efficiency>1) resists, introduces a chemical shot noise defined by the finite number of photo-reactive molecules in a given exposure region.

A complementary approach to patterning is through the so-called bottom up methods. An example of bottom-up method, developed at IBM, relies on specific directed self-assembly to build structures on a nanometer scale using phase separation of the blocks in di-block polymers. Uncertainties in predicting topical nucleation centers and ultimate size distribution of di-block polymer molecular components also limit the scale and yield of such patterning. Yet another class of methods developed at Harvard, known as soft lithography, uses a nano-scale patterned soft stamp to print an inked pattern on a surface (of wafer/glass). The ink used is made up of self-assembling surfactant molecules which then act as a resist. In this approach, the pattern reproducibility fades due to the mechanical wear of the stamp material.

SUMMARY OF THE INVENTION

There thus exists a need in the art to overcome the above difficulties of the prior art.

It is therefore an object of the invention to form structures at a smaller scale than has traditionally been possible.

It is another object of the invention to be able to do so while avoiding shot noise and line-edge roughness.

To achieve the above and other objects, the present invention is directed to a hybrid approach to craft sub 50 nm dimension contact holes exploiting controllable (1) narrower size distribution in nanoparticle dimensions compared to lithographically patterned holes and (2) ability to deposit nanoparticles at the center of such holes ($r_{nanoparticles} < r_{Hole}$, where r is the radius) using electrostatic funneling (EF). EF is generated by an exposed and charged self-assembled monolayer underneath a photo-lithographically patterned resist film. The lithographic fluctuations due to shot noise in the hole pattern dimensions are removed by a resist reflow around predeposited nanoparticles. It also exploits the fundamental surface-tension-based forces to smooth out line edge roughness as well. Conceptually, as long as $\sigma_{Nanoparticle} < \sigma_{Hole}$, where $\sigma$ is the standard deviation of the radius, such a technique should be able to remove shot noise, line-edge roughness and shrink the dimension of the hole to match the dimension of the deposited nano-objects.

In at least one embodiment, negatively charged nanoparticles formed of gold or another suitable substance that can be etched away separately from the resist are deposited into positively charged holes in the resist. Since the negatively charged nanoparticles are attracted to the positively charged hole and repel one another, a suitable density of deposited nanoparticles can be achieved.

The present invention provides a method to pattern sub-50-nm structures using sequential top-down and bottom up lithographies in conjunction with selective etching. The preferred rendition of the method involves: (a) rough lithographic patterning, (b) size/shape selected nanostructure deposition, (c) resist reflow around the nanostructures, and (d) selective removal/etching of the nano structure.

The present invention overcomes the existing limitations of shot noise (observed in optical, e-beam, X-ray, and EUV lithographies) and line edge roughness noted in the current generation of lithographic nano-patterning methods.

Any reflowable resist can be used in this type of patterning.

Patterning (depositing) nanostructures can be based on different materials such as metals, insulators and semiconductors, as long as they can be selectively etched.

One application is Back end of line (BEL) processing involving patterning of interconnect structures where via (to connect from one layer to another) and trenches are needed to wire electrical circuit patterns on semiconductor chips, such as microprocessors, memory cells etc. Size controlled nanoparticles and nanowires can be used in the fabrication of via and trench structures respectively.

Yet another application of the method could involve complex geometric nanostructures such as rings, discs, cubes and helices to selective deposit and pattern structures, such as those useful for protein/DNA biochips. Any suitable nanostructure can be formed through the use of nanowires or the like. The patterning of the resist would be adjusted accordingly to provide a suitable pattern to receive the nanowires or other nanostructures used.

It is contemplated that the structures formed will have a size range of 2 nm to hundreds of nm. Sizes outside of that range are also possible. Patterns of extremely fine resolution (e.g., below 20 nm) can be formed through conventional 193 nm lithography by reflowing over the nanoparticles/nanostructures. Thus, the resolution limit of the lithographic technique used is no longer a resolution limit set by the wavelength of exposure source for the formation of the nano/microstructures.

The nanoparticles or nanostructures can be formed from a metal, an insulator, a semiconductor, or any other suitable material. The substrate can be a semiconductor, an insulator such as glass, a metal, or any other suitable material, including a composite patterned substrate that contains metal, semiconductor, insulator surfaces or combinations thereof.

BRIEF DESCRIPTION OF THE DRAWINGS

A preferred embodiment of the present invention will be set forth in detail with reference to the drawings, in which.

DETAILED DESCRIPTION OF THE PREFERRED EMBODIMENT

A preferred embodiment of the present invention will be set forth in detail with reference to the drawings, in which like reference numerals refer to like elements or steps throughout.

Figure 1A:
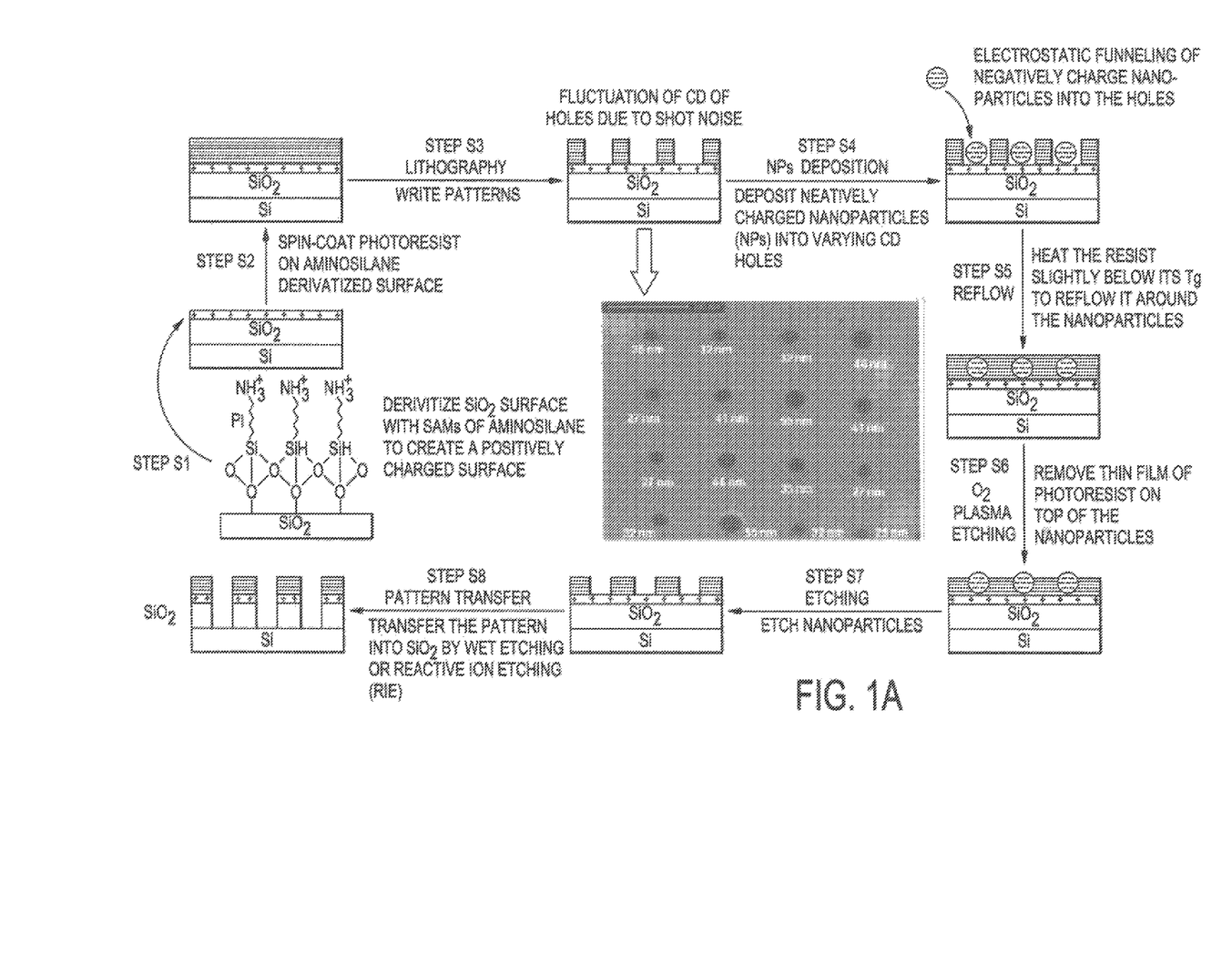
FIG. 1A is a schematic representation of the process according to the preferred embodiment.

The process according to the preferred embodiment will be explained with reference to FIG. 1A and FIG. 1B. FIG. 1A shows the strategy to remove effects of shot noise and line-edge roughness for contact hole patterning using NPs of precise size. Here, the critical dimension (CD) is the desired dimension of the holes. The approach (Step S1) begins with depositing a self-assembled monolayer (SAM) 106 of silane molecules bearing positively charged amine groups 104 on the oxide surface of a silicon wafer 108. Next, E-beam lithography is used to pattern holes (Steps S2 and S3) in a poly-methyl methacrylate (PMMA) photoresist film 102, which generates shot noise as illustrated (in the SEM pattern). The lithography exposes amine groups at the bottom of the holes 110. Step S4 entails aqueous phase deposition of controlled-size, citrate-capped (negatively charged) gold nanoparticles (GNPs) 112 in the lithographically patterned holes using electrostatic funneling (EF). In step S5, the PMMA is reflown around pre-deposited nanoparticles by heating the wafer to 100° C. (below its glass transition temperature, 110° C.) which engulfs the nanoparticles. The hole-size corresponding to the GNP dimension is recovered by oxygen plasma etching (Step S6) to expose the GNPs followed by wet etching (iodine) of the GNPs (Step S7). Pattern transfer in $SiO_2$ (Step S8) can be achieved by reactive ion etching or wet etching.

Figure 1B:
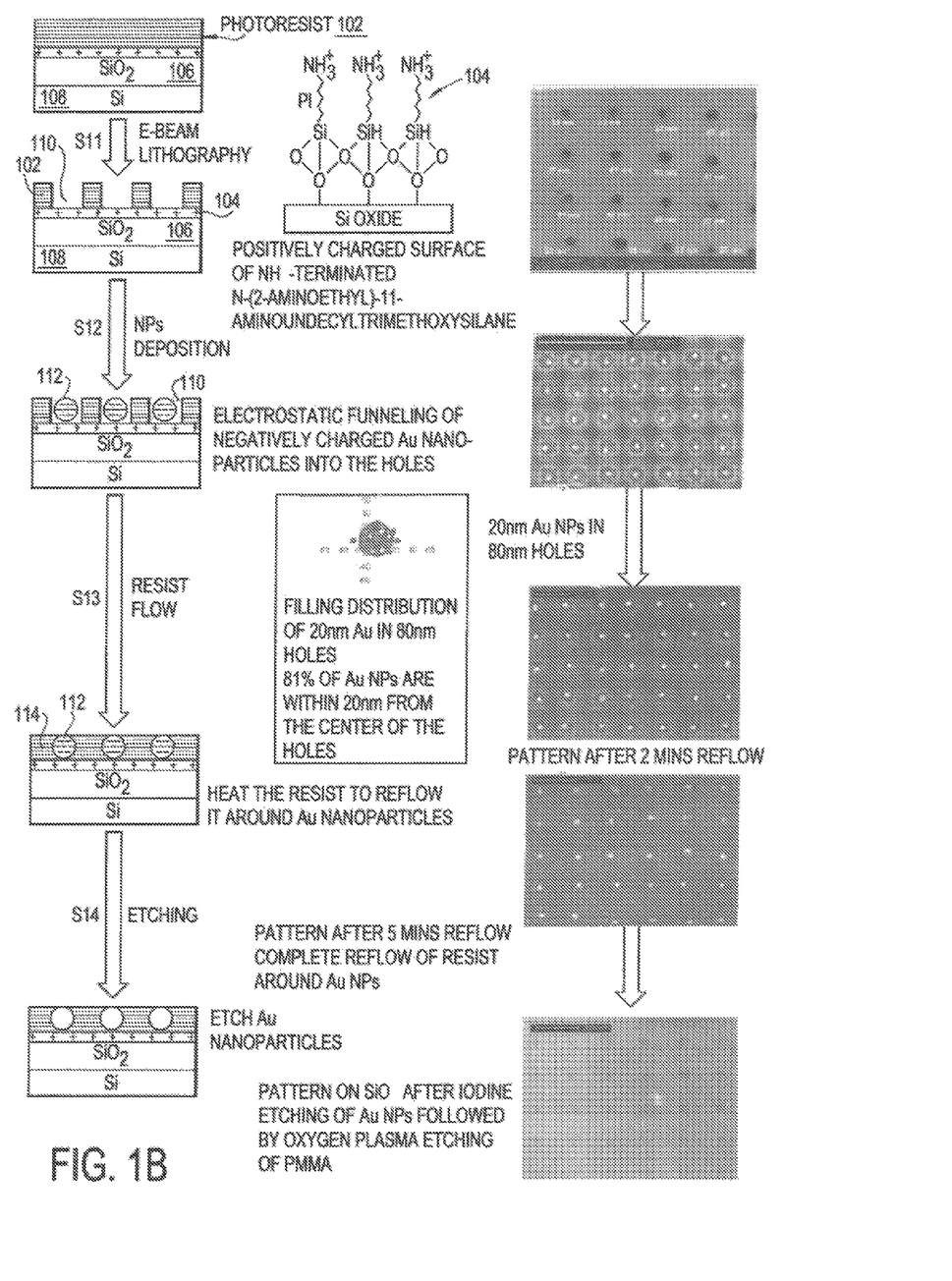
FIG. 1B is a set of photographs showing experimental results of the process of FIG. 1A.

With reference to FIG. 1B, the initial structure included a photoresist (PMMA) film 102, a positively charged surface 104 of $NH_2$-terminated N-(2-aminoethyl)-11-aminoundecyltrimethoxysilane (AATMS), a layer 106 of $SiO_2$ (or another suitable material such as BARC), and a layer 108 of Si. The photoresist film 102 can be applied through spin-coating or in any other suitable way. We used conventional e-beam lithography in step S11 to pattern the PMMA resist film 102 on top of the cationic self-assembled monolayer of the AATMS to form holes 110. Pitch, resist thickness, and hole dimensions were varied. In step S12, negatively charged gold nanoparticles 112 (citrate capped) were deposited close to the center of each hole 110, with 93 percent of the particles 112 lying within one standard deviation of particle size with respect to the center of the hole 110. This electrostatic funneling immediately implies that the PMMA surface may bear a negative charge. For resist reflow in step S13, we used temperatures slightly below the glass transition temperature of the PMMA. The inwardly advancing polymer interface 114 engulfed the gold nanoparticles 112 within 5 minutes. Given that we used nanoparticle dimensions thinner than the resist film thickness, the overlying PMMA polymer was removed to expose gold nanoparticles by $O_2$ plasma, and the exposed gold nanoparticles were etched in step S14 by an $I_2$ etching solution. The resulting pattern can then be etched into the $SiO_2$ layer 106 by reactive ion etching (RIE) or by any other suitable technique such as wet etching using buffered hydrofluoric acid based formulations.

Figure 2A:
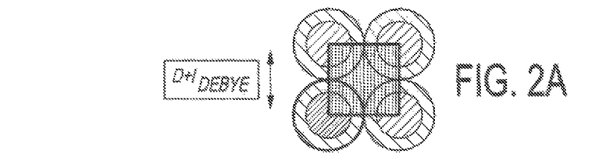
FIG. 2A is a diagram showing a theoretical maximum limit of closest packing of nanoparticles on unpatterned surface.

Assuming random loose packing of gold NP on the derivatized surface, it is easy to show that the packing density on the surface is given by:

$$\rho = \frac{\alpha}{(D + \beta l_{Debye})^2},$$

where D is the nanoparticle diameter, $l_{Debye}$ is the Debye/screening length (inversely proportional to the square root of the ionic strength), and $\alpha$ and $\beta$ are adjustable parameters with $\beta$ approximately equal to one for the closest square planar packing, as shown in FIG. 2A.

Figure 2B:
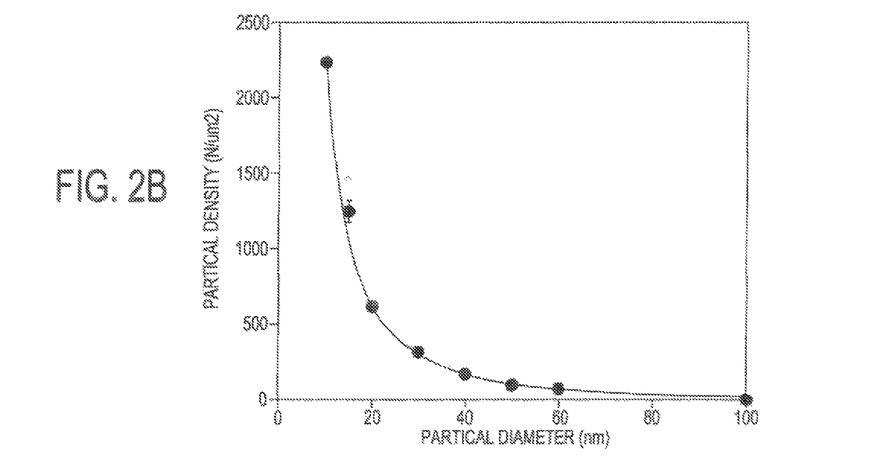
FIG. 2B is a graph showing particle density as a function of particle diameter.

FIG. 2B is a plot of particle density in $N/\mu m^2$ as a function of particle diameter varying between 10 to 100 nms. The fitted line is a best fit to equation of type described above $(\rho = \alpha/(D+\beta \cdot l_{Debye})^2)$ with $\alpha = (3.11 \pm 0.03) \times 10^4$ and $\beta = 0.44 \pm 0.02$, and $l_{Debye}$ is the Debye length in the colloidal solution of gold NPs (nanoparticles).

Figure 2C:
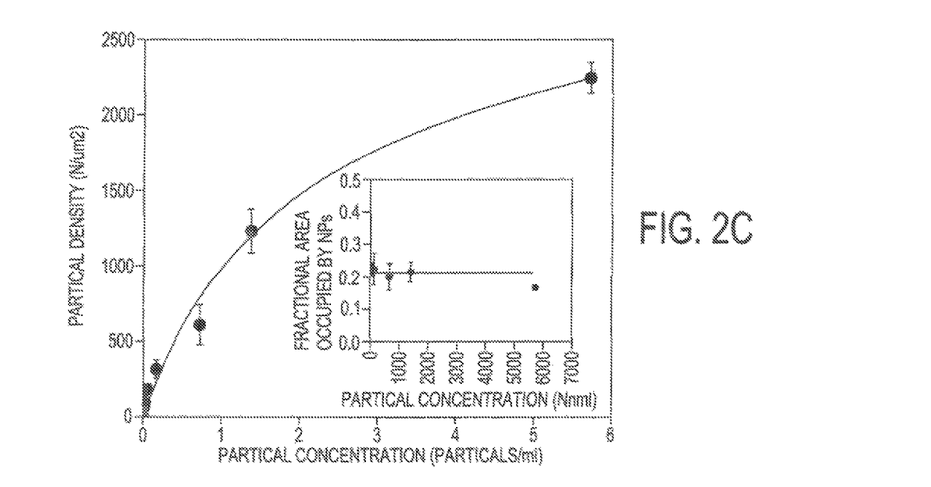
FIG. 2C is a graphs showing particle density as a function of particle concentration.

FIG. 2C is a plot of particle density in $N/\mu m^2$ as a function of particle concentration in particles/ml. Particle density follows the Langmuir type of adsorption equation $\rho=a[C]/(1+b[C])$ with best fit values of $a=(1.4\pm0.1)\times10^{-9}$ and $b=4.6\pm0.7\times10^{-13}$. However, the inset shows that when particle density is converted to fractional area occupied by Au NPs (gold nanoparticles), it shows a remarkably constant value of $0.22\pm0.02$ regardless of particle size or concentration.

Figure 2D:
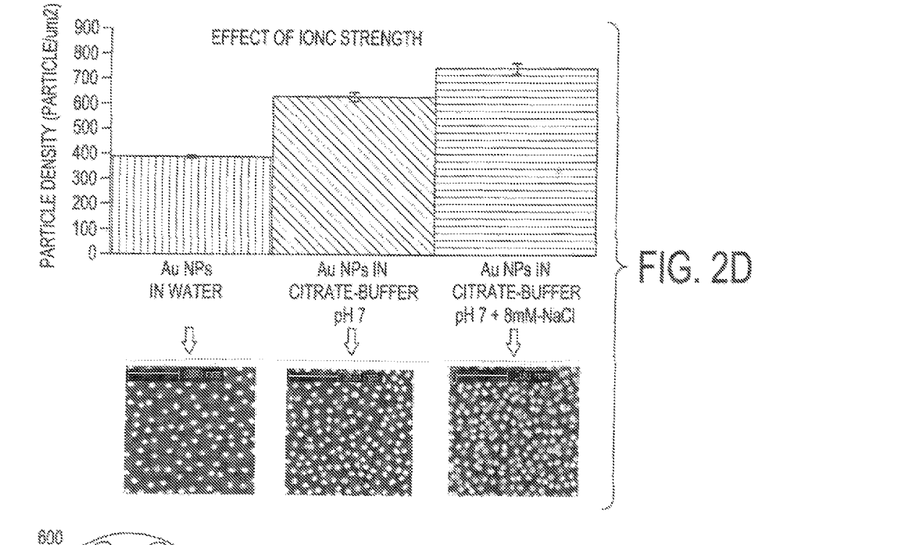
FIG. 2D is a graph showing particle density as a function of ionic strength.
Figure 2E:
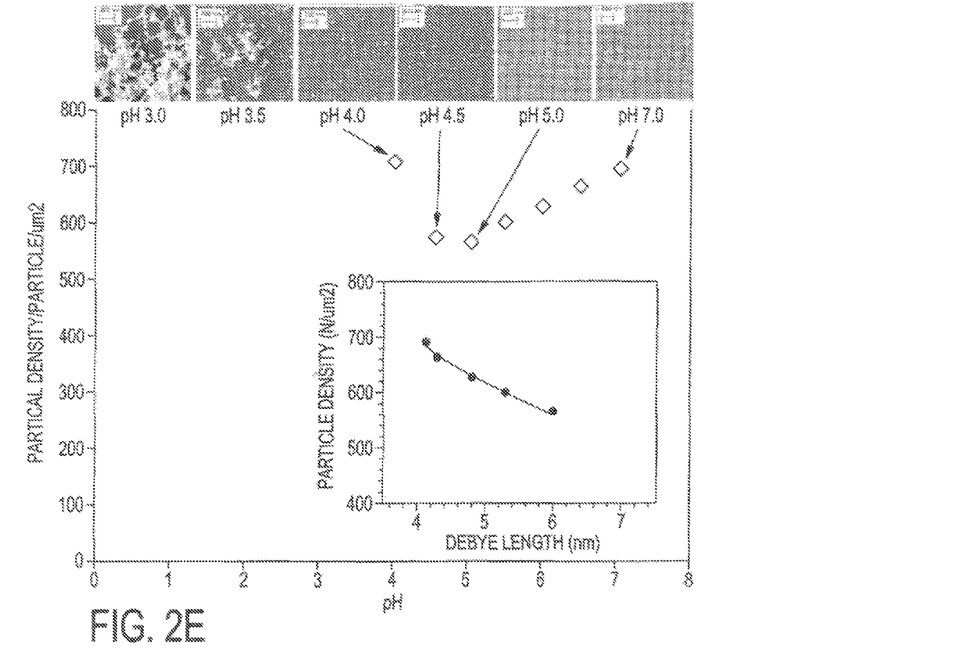
FIG. 2E is a graph showing particle density as a function of pH.

Because of the relationship between the Debye length and the ionic strength, increased ionic strength allows increased particle density, as shown in FIG. 2D. The change in ionic strength affects the Debye length, which in turn controls the packing density, as shown in scanning electron micrographs of FIG. 2D. Similarly, we varied the Debye length through variation of pH to assess its effect on particle density. The results are shown in FIG. 2E. Below pH 4, nanoparticles begin to coagulate and precipitate out of the solution. Near pH 4, gold NPs show a tendency to flocculate. Above pH 4, the particle density increases with increase in ionic strength as predicted by the equation above. Particle density appears to follow the simple behavior given in FIG. 2B with $\beta=0.7\pm0.1$ and $\alpha=1.1\pm0.6\times10^5$. The best fit line is shown in the inset of FIG. 2E, where deposited particle density, $\rho$, is plotted as a function of $l_{Debye}$.

Figure 2F:
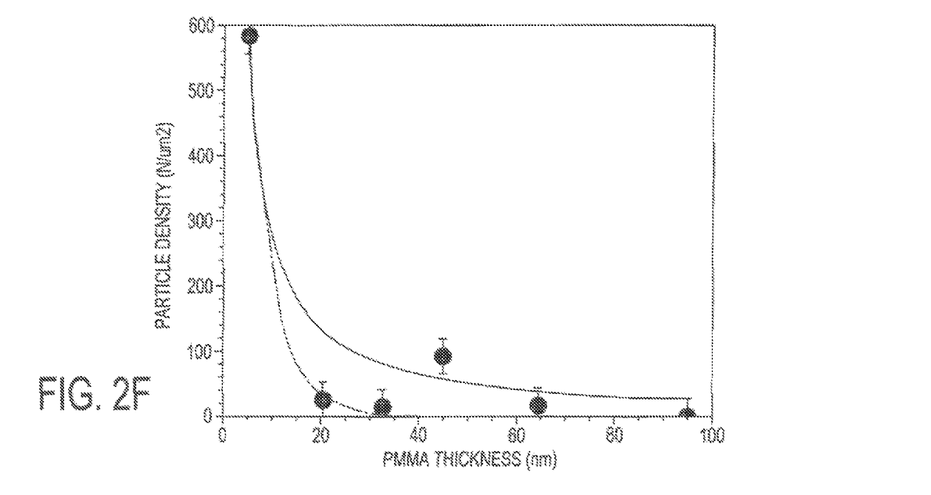
FIG. 2F is a graph showing particle density as a function of resist thickness.

FIG. 2F shows the effect of resist thickness z for both a hyperbolic model and an exponential model. In the hyperbolic model, $\rho(z)=a/z$, where $a=2737\pm5$. In the exponential model, $\rho(z)=a\ \exp\ (-bz)$, where $a=1430\pm14$, and $b=0.181\pm0.002$.

Figure 2G:
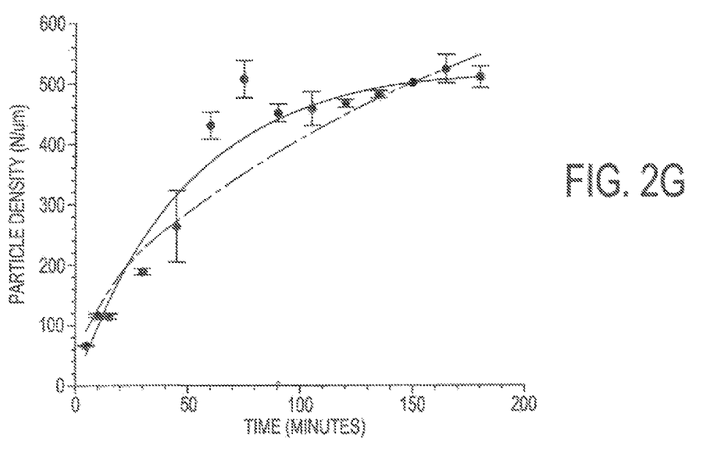
FIG. 2G is a graph showing particle density as a function of time.

FIG. 2G shows the time dependence of deposition for 20 nm gold nanoparticles for both an irreversible-adsorption model and a simple-diffusion model. For irreversible adsorption, $\rho(t)=\rho(\infty)(1-\exp(-bt))$, where $\rho(\infty)=523\pm2$, and $b=0.0204\pm0.0002$. For simple diffusion, $\rho(t)=at^{1/2}$, where $a=40.74\pm0.06$, which was used to determine the particle diffusion coefficients using Fick's law of diffusion to be about $6.4\times10^{-8}\ cm^2/sec$. The plot shows that 2-3 hours of deposition time is sufficient.

Figure 3:
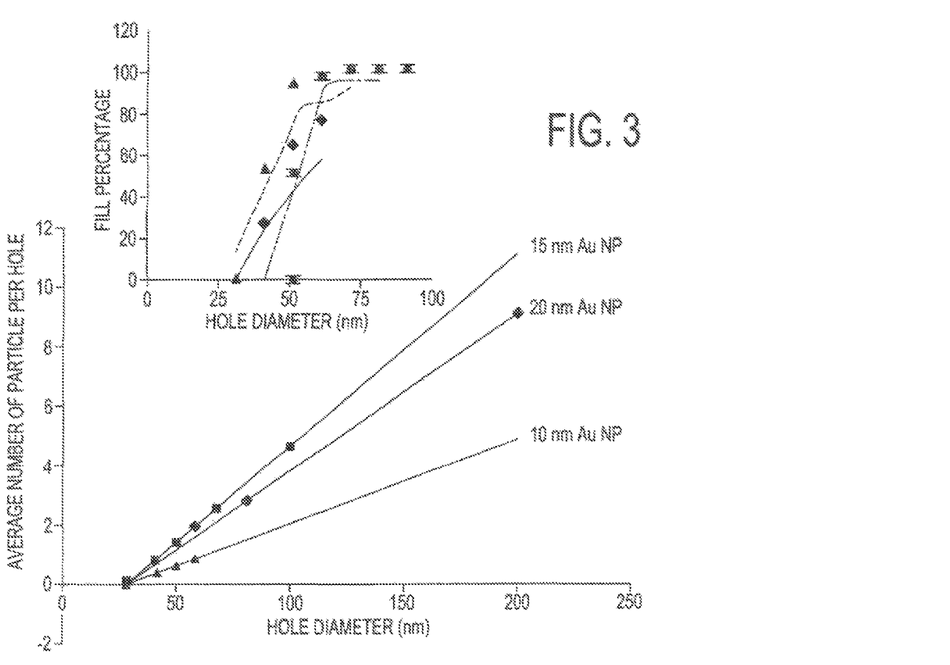
FIG. 3 is a graph showing the average number of particles per hole as a function of hole diameter.

FIG. 3 shows the average number of particles deposited in holes. As seen, that average number has a linear dependence on the diameter of hole, regardless of the NP particle size. The fill percentage of holes follows Poisson statistics; fill percentage, $f=100(1-e^{-<N>})$ where N is the average number particles per hole. For 4 nm thick AATMS film, 110 nm thick PMMA resist film, and 10 nm Au NPs, the hole filling fraction is 29% for 40 nm holes, 64% for 50 nm holes, and 76% for 60 nm holes. Gold nanoparticles do not deposit in 30 nm and smaller holes in the currently developed embodiments of the invention because of surface charge neutrality, although that may change in other embodiments falling within the scope of the invention. The PMMA thickness is also relevant; for 15 nm Au NPs in 70 nm holes and a 175 nm layer of $SiO_2$, the filling fraction within 48 hours is 100% for PMMA=60 nm and 95% for PMMA=85 nm.

Figure 4A:
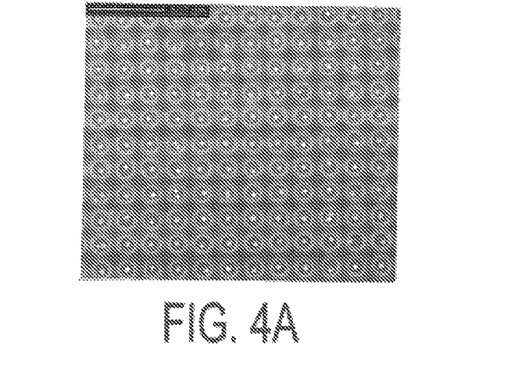
FIGS. 4A through 4D are photographs showing stages in the process.
Figure 4B:
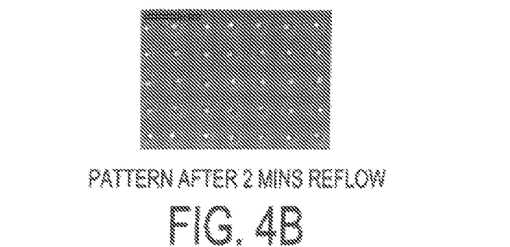
Figure 4C:
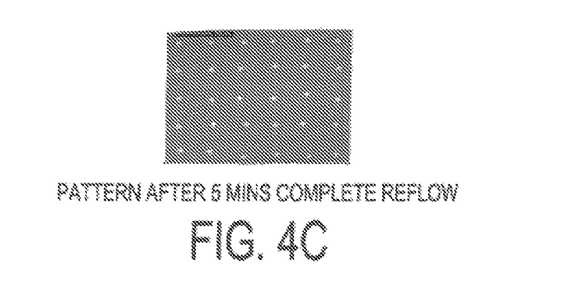
Figure 4D:
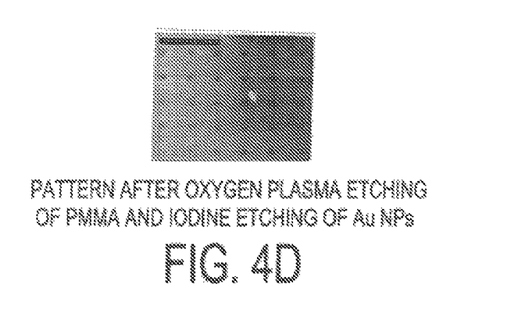

FIG. 4A shows 20 nm gold NP in 80 nm holes patterned in a 100 nm thick PMMA resist. It shows that 93% of the holes contain one nanoparticle, that 81% of the nanoparticles are within 20 nm from the center of the holes, and that 73% of the nanoparticles are within 10 nm from the center of the holes. FIGS. 4B and 4C show reflow at 100° C. for 2 and 5 minutes, respectively, followed by $O_2$ plasma to remove the top layer of the resist to expose the gold NPs, which were etched using $I_2/KI$ solution, as shown in FIG. 4D. This illustrates how any hole size fluctuations between 30 nm to 80 nm can be removed to make uniform 20 nm size holes using 20 nm size NPs.

Figure 5A:
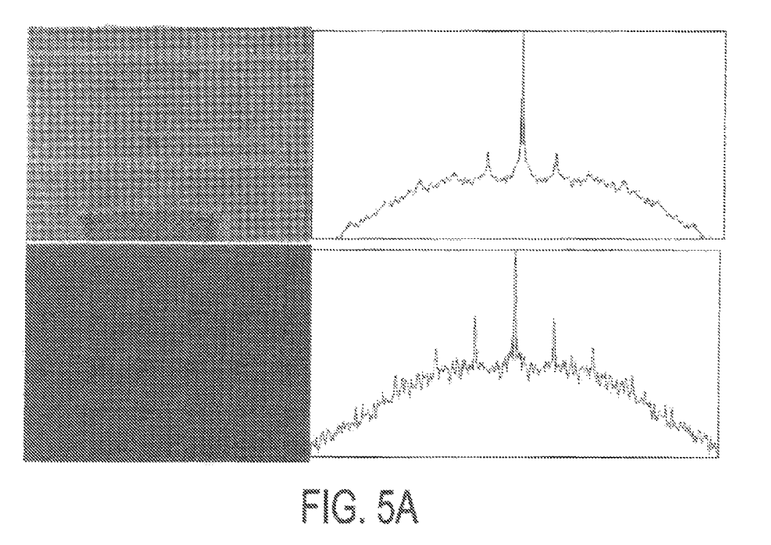
FIG. 5A shows SEM images of holes with Au NP before (top) and after (bottom) resist reflow, respectively along with graphs of averaged 2D Fourier transforms of the corresponding images.
Figure 5B:
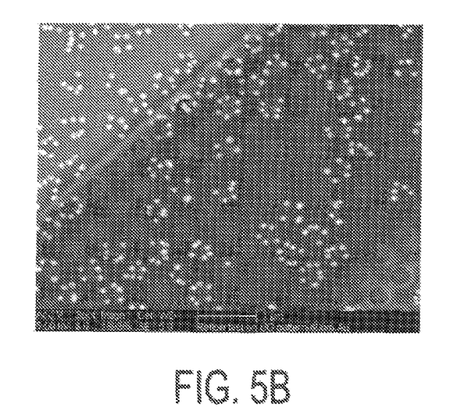
FIG. 5B depicts positions of Au NPs deposited in large partially melted PMMA resist holes.

FIG. 5A shows photographs and Fourier analyses of the particles before and after reflowing. As shown, the nanoparticles do not move during the reflowing step as reflected in identical periodicity of the Fourier transforms. This is more clearly and qualitatively illustrated in the partially resist renown sample shown in FIG. 5B.

Figure 6:
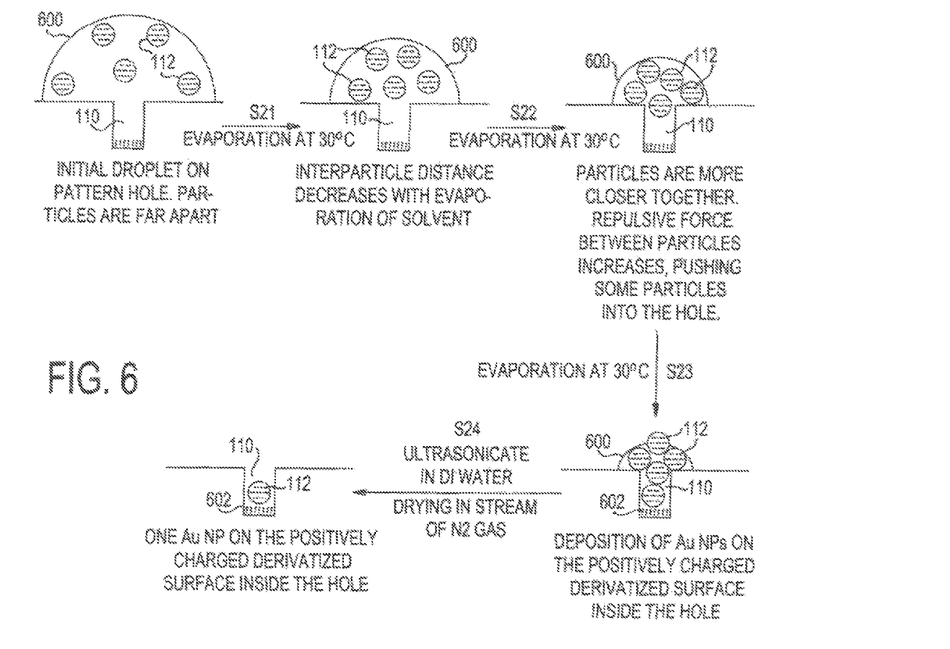
FIG. 6 is a flow chart showing an evaporative technique for deposition of the gold nanoparticles.

FIG. 6 shows a different technique for deposition of the nanoparticles, namely, evaporative deposition. An initial droplet 600 of solvent containing negatively charged gold nanoparticles 112 is deposited on a positively charged pattern hole 110. The particles 112 are far apart because of their negative charges. In step S21, evaporation of the solvent at 39 degrees C. commences. As the droplet 600 evaporates, the interparticle distance decreases. As the evaporation continues in step S22, the particles 112 are forced closer together. The repulsive force between the particles 112 increases, pushing some of the particles 112 into the hole 110. As the evaporation continues in step S23, particles 112 are deposited on the positively charged surface 602 of the hole 110. Step S24 includes ultrasonication in deionized water and drying in a stream of nitrogen gas. One gold nanoparticle is left on the positively charged surface 602 of the hole 110.

Figure 7:
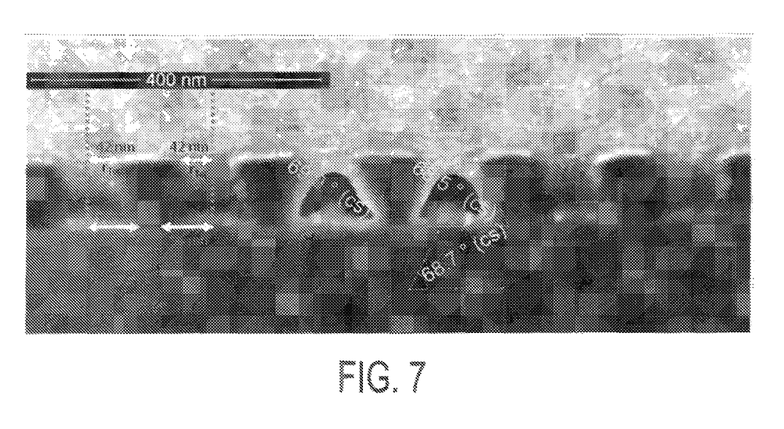
FIG. 7 is a photograph showing a cross-sectional view of holes in the resist film.

FIG. 7 is a cross-sectional view of the holes. Because of the back-scattering of electrons, each hole has a non-uniform radius; that is, the top and bottom radii $r_{Top}$ and $r_{Bottom}$ differ. That difference allows more particles to be packed in the large holes; please note FIG. 5B. However, the holes merge when Pitch length$\leq 2r_{Top}+0.5r_{Bottom}$, requiring lithographic optimization for smaller pitch lengths. Optimal electrostatic funneling will occur when the hole side-wall angle with respect to the substrate is 90 degrees or more when measured from the substrate side.

Figure 8A:
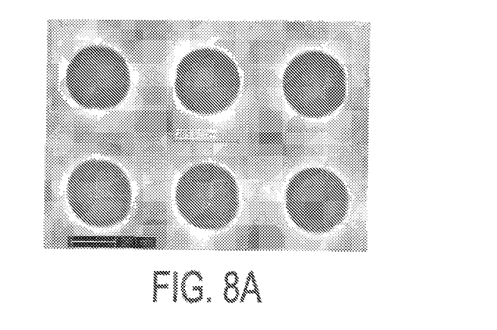
FIG. 8A shows a 200 nm hole is prior to reflow.
Figure 8B:
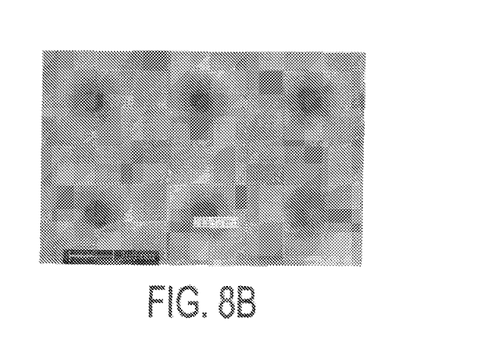
FIG. 8B depicts shrinkage of the hole after a partial reflow.

FIGS. 8A and 8B show holes in photoresist thin films before and after reflow. The glass transition temperature (Tg) of PMMA is 110° C. The PMMA resist reflow below Tg is made possible by further reduction in Tg, resulting from polymer chain cleavage during the exposure of the samples to the electron beam. The optimal resist reflow temperature is 100° C. The hole size before reflow is 285.50 nm; after 200 s, the hole size decreases to 113.73 nm. The rate of reflow of 91 nm PMMA film at 100° C. is $1.67\pm0.14$ nm/s.

While a preferred embodiment has been set forth above, those skilled in the art who have reviewed the present disclosure will readily appreciate that other embodiments can be realized within the scope of the invention. For example, numerical values are illustrative rather than limiting. Also, any suitable type of lithography (e.g., optical, EUV, x-ray) can be used. Moreover, materials are illustrative rather than limiting, as long as reflow and selective etching are possible. The invention can be extended to such areas as reduction of trench linewidth roughness, the use of cheaper nanoparticles based on materials such as silica, the use of DUV resist and optical lithography, electrical bias/photobase generators for improved nanoparticle centering. Other variations have been noted above. Therefore, the present invention should be construed as limited only by the applied claims.

What is claimed is:

1. A method for forming a nanostructure, the method comprising:
   (a) providing a layer of a resist on a substrate;
   (b) patterning the resist to form areas where the resist has been removed;

(c) depositing nanostructures into the areas, the nanostructures comprising a material capable of being selectively etched separately from the resist;

(d) reflowing the resist around the nanostructures; and (e) selectively etching away the nanostructures.

2. The method of claim 1, wherein step (b) is performed lithographically.

3. The method of claim 1, wherein the nanostructures are nanoparticles.

4. The method of claim 1, wherein the material capable of being selectively etched comprises a metal.

5. The method of claim 4, wherein the metal comprises gold.

6. The method of claim 1, wherein the material capable of being selectively etched comprises an insulator.

7. The method of claim 1, wherein the material capable of being selectively etched comprises a semiconductor.

8. The method of claim 1, wherein step (d) comprises heating the resist.

9. The method of claim 8, wherein step (d) comprises heating the resist to a temperature slightly below a glass transition temperature of the resist.

10. The method of claim 1, wherein the substrate is a semiconductor substrate.

11. The method of claim 1, wherein the substrate is an insulator.

12. The method of claim 11, wherein the insulator is glass.

13. The method of claim 1, wherein the substrate is a metal substrate.

14. The method of claim 1, wherein the substrate is a composite patterned substrate that contains metal, semiconductor, insulator surfaces or combinations thereof.

15. The method of claim 1, wherein step (c) is performed using electrostatic funneling.

16. The method of claim 15, wherein, in step (c), the nanostructures are negatively charged.

17. The method of claim 1, wherein step (c) is performed using evaporative deposition.

18. The method of claim 17, wherein, in step (c), the nanostructures are negatively charged.

19. The method of claim 17, wherein the evaporative deposition is followed by ultrasonication and drying.

* * * * *